_US005312716A_

United States Patent [19]

Unoki et al.

[11] Patent Number: 5,312,716
[45] Date of Patent: May 17, 1994

[54] PROCESS FOR PRODUCING A SEMICONDUCTOR

[75] Inventors: Masao Unoki; Shunsuke Yokotsuka; Masaru Nakamura, all of Yokohama, Japan

[73] Assignee: Asahi Glass Company Ltd., Tokyo, Japan

[21] Appl. No.: 894,760

[22] Filed: Jun. 5, 1992

[30] Foreign Application Priority Data

Jun. 6, 1991 [JP] Japan ................................. 3-162171

[51] Int. Cl.$^5$ .............................................. G03C 5/00
[52] U.S. Cl. ................................... 430/313; 430/314; 430/317; 430/323; 257/642; 257/759
[58] Field of Search ............... 430/313, 314, 317, 323; 257/642, 759

[56] References Cited

U.S. PATENT DOCUMENTS 5,117,272  5/1992  Nomura et al. ................... 257/642

*Primary Examiner*—John Kight, III
*Assistant Examiner*—Duc Truong
*Attorney, Agent, or Firm*—Oblon, Spivak, McClelland, Maier & Neustadt

[57] ABSTRACT

A process for producing a semiconductor having a thin film of a fluorine resin as a protective film, which comprises coating on the surface of a fluorine resin a photoresist solution containing a surfactant, followed by exposure, development and etching for fine processing of the fluorine resin.

17 Claims, No Drawings

PROCESS FOR PRODUCING A SEMICONDUCTOR

BACKGROUND OF THE INVENTION

1. Field of the Invention

The present invention relates to a process for producing a semiconductor having a thin film of a fluorine resin as a protective film.

2. Discussion of Background

Heretofore, it has been usually difficult to form a thin film of a fluorine resin by coating, since the fluorine resin is usually insoluble in a solvent. However, fluorine resins soluble in special solvents have been developed as disclosed in Japanese Unexamined Patent Publications No. 238111/1988 and No. 260932/1988 and U.S. Pat. No. 4,754,009, and their application to semiconductor protective films utilizing their electrical properties and low water absorptivity, has been disclosed in European Patent 0393682.

On the other hand, an organic thin film used as a protective film of a semiconductor is required to be subjected to fine processing such as local perforation processing to take electrical connection or wire bonding, and photolithography using a photoresist is usually employed for this purpose.

However, the above fluorine resins have a high fluorine content and an extremely low surface energy, and therefore they tend to repel a photoresist solution, whereby it has been difficult to uniformly coat it by e.g. spin coating, and it has been difficult to apply fine processing by photolithography.

Further, in order to improve the uniformity in the application of a photoresist, it has been common to employ a method wherein an adhesion-improving agent such as HMDS (hexamethyl disilazane) is coated in a liquid state, and a photoresist is coated thereon, followed by photolithography. However, the above-mentioned fluorine resins tend to repel even such a solution, and it has been difficult to improve the adhesion by coating. Thus, there has been a problem that it is required to heat the adhesion-improving agent to conduct treatment by its vapor, or it is required to improve the wettability of the surface by such a method as vapor deposition of e.g. a metal.

SUMMARY OF THE INVENTION

It is an object of the present invention to solve such drawbacks of the conventional process for producing a semiconductor using a fluorine resin as a protective layer and to provide a new process for producing a semiconductor excellent in the electrical properties and the moisture resistance.

The present inventors have conducted extensive studies with recognition of the above problems and as a result, have found it possible to conduct fine processing of a fluorine resin having a low surface energy by incorporating a surfactant to a solution of a photoresist or an adhesion-improving agent and thereby to produce a semiconductor having a protective layer of such a fluorine resin.

Thus, the present invention has been accomplished on the basis of the above discovery, and it provides a process for producing a semiconductor having a thin film of a fluorine resin as a protective film, which comprises coating on the surface of a fluorine resin a photoresist solution containing a surfactant, followed by exposure, development and etching for fine processing of the fluorine resin.

The present invention also provides a process for producing a semiconductor having a thin film of a fluorine resin as a protective film, which comprises coating on the surface of a fluorine resin a liquid containing a surfactant, then coating a solution of a photoresist, followed by exposure, development and etching for fine processing of the fluorine resin.

DETAILED DESCRIPTION OF THE PREFERRED EMBODIMENTS

In the present invention, the fluorine resin may be a fluorine resin obtained by homopolymerizing or copolymerizing a fluorine-containing monomer such as tetrafluoroethylene, chlorotrifluoroethylene, hexafluoropropylene or a perfluoroalkyl vinyl ether, a fluorine-containing polyimide, a fluorine-containing acrylic polymer or a polymer having a fluorine-containing alicyclic structure. Among them, a polymer having a fluorine-containing alicyclic structure is preferred from such viewpoints that a thin film can be formed by coating, the dielectric constant is low whereby an improvement in the response speed of a semiconductor element can be expected, and the water absorptivity is low whereby an improvement in the moisture resistant stability of the element can be expected.

In the present invention, as the polymer having a fluorine-containing alicyclic structure, a wide range of polymers including known or well known polymers may be mentioned. Thus, in the present invention, a fluorine-containing polymer having such a specific cyclic structure in the backbone chain is preferably employed.

For example, those having cyclic structures of the following formulas 1, 2, 3 and 4 may be mentioned. In the formulas 1, 2, 3 and 4, h is from 0 to 5, i is from 0 to 4, k is from 0 to 1, h+i+k is from 1 to 6, R is F or CF$_3$, each of j, p and q is from 0 to 5, provided j+p+q is from 1 to 6, and each of R$_1$ and R$_2$ is F or CF$_3$.

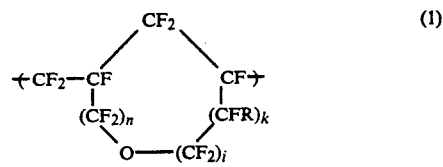

(1)

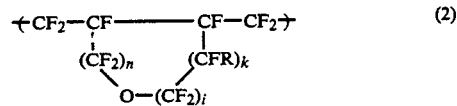

(2)

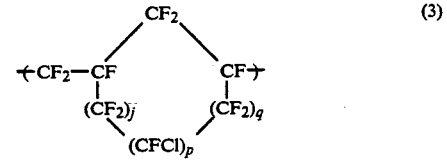

(3)

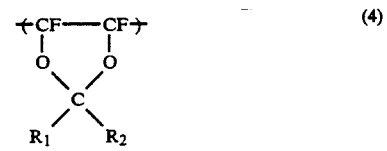

(4)

Among these, polymers having the following cyclic structures are representative. However, it should be understood that the present invention is by no means restricted to such specific examples.

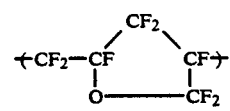
(5)

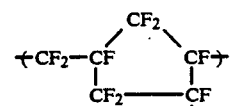
(6)

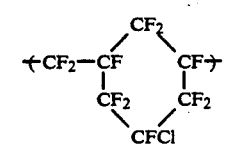
(7)

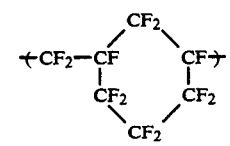
(8)

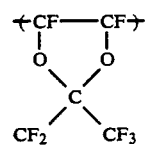
(9)

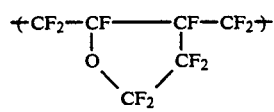
(10)

The following two methods are available for the production of such polymers. However, the present invention is by no means restricted to such methods.

1. Cyclic polymerization

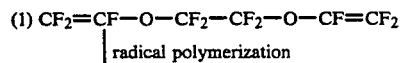

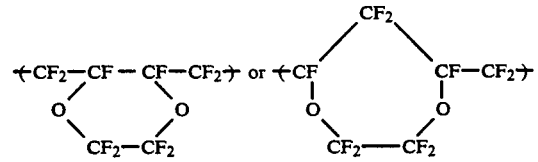

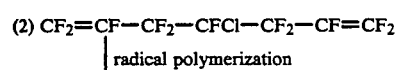

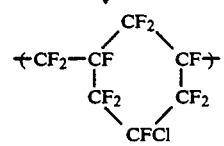

(3) $CF_2=CF-O-CF_2-CF=CF_2$
| radical polymerization

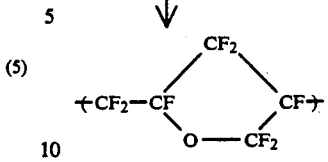

2. By means of a cyclic monomer (U.S. Pat. No. 3,978,030)

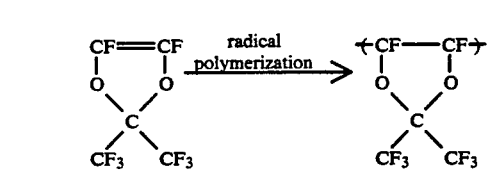

In the foregoing, polymers having perfluoroalicyclic structures have been described. However, in the present invention, those corresponding to the above described polymers wherein some of fluorine atoms are substituted by hydrogen atoms or organic groups, or those having cyclic structures having the following formulas 11 and 12, may also be employed:

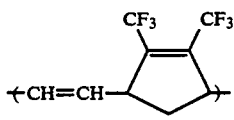
(11)

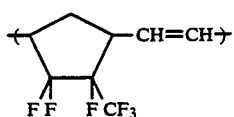
(12)

Thus, the polymer having a specific cyclic structure in the present invention can be smoothly and advantageously obtained by the cyclic polymerization as described above. Particularly when a monomer having two polymerizable groups having different polymerizability in one molecule, wherein the number of atoms in the straight chain portion of the connecting chain connecting the two polymerizable groups is from 2 to 7, is used, the cyclic polymerization can be proceeded smoothly and advantageously while suppressing gelation, without employing super high pressure conditions or substantial diluting conditions.

Firstly, the monomer suitable for such cyclic polymerization preferably has two carbon-carbon multiple bonds having different polymerizability. Usually, carbon-carbon double bonds are employed. For example, a fluorine-containing monomer having two multiple bonds having asymmetrical structures, a combination of a vinyl group and an allyl group, a combination of a vinyl ether group and a vinyl group, a combination of a fluorine-containing multiple bond and a hydrocarbon multiple bond, or a combination of a perfluoromultiple bond and a partially fluorinated multiple bond, may be mentioned.

Secondly, the number of atoms in the straight chain portion of the connecting chain which connects these two carbon-carbon multiple bonds, is from 2 to 7. If the number of atoms in the straight chain portion of the connecting chain is 0 or 1, the cyclic polymerization hardly takes place, and the same is true also in the case where the number of atoms is 8 or more. Usually, such a number of atoms is preferably from 2 to 5. The connecting chain is not restricted to a straight chain, and may have a side chain structure or a cyclic structure. Further, the constituting atoms are not restricted to carbon atoms, but may include hetero atoms such as O, S and N.

Thirdly, the one having a fluorine content of at least 10% by weight, is preferred. If the fluorine content is too small, the specificity depending on the fluorine atoms tends to be hardly obtainable. Needless to say, a perfluoromonomer may suitably be employed.

Specific examples of such specific fluorine-containing monomer include the following:

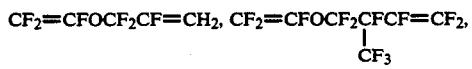

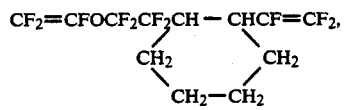

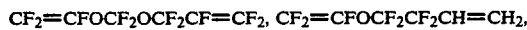

$$CF_2=CFOCF_2(CH_2)_xNHCCH=CH_2$$

(wherein x is an integer of from 0 to 3)

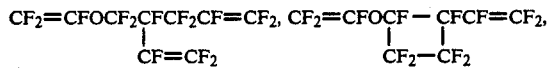

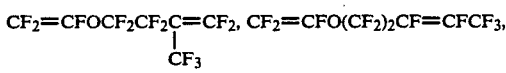

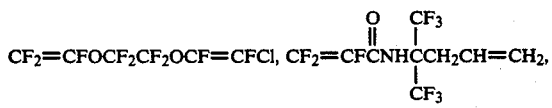

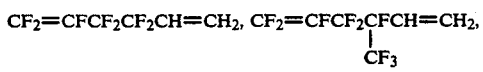

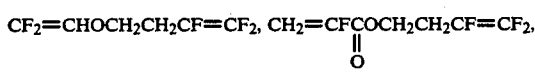

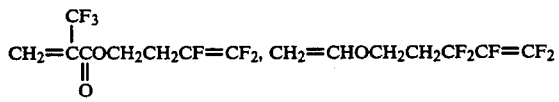

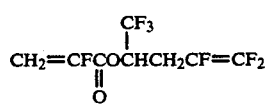

In the present invention, the one having one vinyl ether group of $CF_2=CFO-$ is preferably employed from the viewpoint of the polymerization reactivity, the cyclic polymerizability, the gelation suppression, etc. Particularly preferred are perfluoroallyl vinyl ether ($CF_2=CFOCF_2CF=CF_2$) and perfluorobutenyl vinyl ether ($CF_2=CFOCF_2CF_2CF=CF_2$).

The above-mentioned monomer components may be used alone or in combination as a mixture of two or more of them. Further, to such an extent that the essential characteristics of these components are not impaired, other copolymerizable components may be incorporated and copolymerized. If necessary, the polymer may be crosslinked by a certain method, as the case requires.

Such other copolymerizable monomers are not particularly limited so long as they are monomers having radical polymerizability, and a wide range of fluorine-containing monomers, hydrocarbon monomers and other monomers, may be mentioned. It is of course possible that these other monomers may be used alone or in combination as a mixture of two or more of them for the radical copolymerization with the above-mentioned monomer capable of introducing the specific cyclic structure.

In the present invention, as such other monomers, fluorine-containing monomers such as fluoroolefins and fluorovinyl ethers, are preferably selected. For example, tetrafluoroethylene, perfluoromethyl vinyl ether, perfluoropropyl vinyl ether or perfluorovinyl ether containing a functional group such as a carboxylic acid group or a sulfonic acid group, is preferred. Further, vinylidene fluoride, vinyl fluoride or chlorotrifluoroethylene may also be mentioned.

As the copolymer composition, the composition of the cyclic structure preferably constitutes at least 20%, more preferably at least 40%, in order to obtain the properties of the specific fluorine containing alicyclic structure intended by the present invention.

In the present invention, a method commonly used for crosslinking may suitably be employed as a method for crosslinking the fluorine-containing polymer. For example, crosslinking may be conducted by copolymerizing a monomer having a crosslinkable site, or by incorporating a crosslinking agent. Otherwise, crosslinking can be conducted by means of radiation.

The photoresist to be used in the present invention may suitably be selected among positive and negative photoresists commonly employed, and the best photoresist may be selected depending upon the size of the desired pattern, the required degree of precision, the properties of exposure apparatus, etc. Further, the viscosity of the photoresist solution is preferably at a high level from the viewpoint such that it can readily be coated on the surface of a fluorine resin by spin-coating.

In the present invention, a surfactant may be incorporated to a photoresist solution, and such a solution is directly coated on the surface of a fluorine resin. However, when an adequate adhesion can not be obtained by this method, the adhesion can be improved by coating a liquid containing a surfactant, followed by coating a photoresist solution. According to the latter method, it is unnecessary to incorporate a surfactant to the photoresist solution. Further, the liquid containing a surfactant to be used in the latter method may be a liquid prepared by adding a surfactant to a solution so-called an adhesion-improving agent, which improves the adhesion between the fluorine resin and the photoresist.

The adhesion-improving agent to be used in the present invention is not particularly limited so long as it is capable of improving the uniformity in coating a photoresist solution to a fluorine resin surface and capable of improving the adhesion. However, hexamethyl disilazane (HMDS) is preferably employed.

The surfactant to be used in the present invention is not particularly limited, so long as it has an effect of lowering the surface tension of the liquid. All types of surfactants including anionic, cationic, nonionic, water-soluble and oil soluble surfactants, may be employed. Further, it is not limited to so-called surfactant, so long as it has the above effects. For example, a surface-modifying agent or a leveling agent, which is used for other purposes, may also be used for this purpose.

Among them, a surfactant compatible with the photoresist or the adhesion-improving agent is preferred to form a uniform coated layer of a resist.

The surfactant to be used in the present invention may not necessarily have a surface tension smaller than the surface tension of the fluorine resin. However, the lower the surface tension, the better. As a surfactant having a particularly low surface tension, a fluorine-containing surfactant is preferably employed.

As to the type of the surfactant, any of anionic, cationic, nonionic or amphoteric type may be used. However, from the viewpoint of the solubility in a photoresist solution, a nonionic surfactant is preferred. Further, it may be of a polymeric type (oligomer type) such as acrylate oligomers having polyfluoroalkyl groups.

The amount of the surfactant in the present invention should better be smaller within a range sufficient to impart an adequate coating property to the surface of the fluorine resin. If the amount is too much, foaming of the liquid is likely to take place, whereby it tends to be difficult to coat the liquid uniformly. When a surfactant is added to a photoresist solution, if the amount is too much, it tends to adversely affect e.g. the resolution of the photoresist.

According to the process of the present invention, a photoresist is coated and if necessary, dried. Then, exposure is conducted by g-line, i-line, a laser beam, an electron beam, etc. by means of a photomask having a desired pattern in accordance with a method commonly employed, followed by development by means of a developing solution suitable for the resist solution to transfer the pattern on the resist. Then, etching is conducted by wet etching with a fluorine type solvent capable of dissolving the fluorine resin used as a protective film or by dry etching employing a plasma of e.g. argon, $CF_4$, $CHF_3$ or oxygen, followed by removal of the resist with e.g. alkali to form a protective film of a fluorine resin having a desired pattern.

Now, the present invention will be described in further detail with reference to Examples. However, it should be understood that the present invention is by no means restricted by such specific Examples.

PREPARATION EXAMPLE 1

20 g of 1,1,2,4,4,5,5-heptafluoro-3-oxa-1,6-heptadiene and 40 g of trichlorotrifluoroethane (hereinafter referred to simply as R113) were charged into a three-necked flask flushed with a nitrogen, and 20 g of $(C_3F_7COO)_2$ was added thereto as a polymerization initiator. The interior of the reaction system was further flushed with nitrogen, and polymerization was conducted at 18° C. for 10 hours. As a result, 10 g of polymer A was obtained. This polymer was a polymer soluble in R-113, and the intrinsic viscosity [$\eta$] was 0.96 dl/g as measured at 30° C. in m-xylene hexafluoride. By $^{19}F$ and $^1H$ NMR, the product was confirmed to be a polymer having a cyclic structure in its backbone chain.

Further, this polymer was colorless transparent and had a surface energy of 20 dyn/cm².

PREPARATION EXAMPLE 2

35 g of perfluorobutenyl vinyl ether, 5 g of R113, 150 g of deionized water and 90 mg of $((CH_3)_2CHOCOO)_2$ as a polymerization initiator were charged into a pressure resistant glass autoclave having an internal capacity of 200 ml. The interior of the system was flushed three times with nitrogen, and then suspension polymerization was conducted at 40° C. for 22 hours. As a result, 28 g of polymer B was obtained. The intrinsic viscosity [$\eta$] of this polymer was 0.24 dl/g as measured at 30° C. in perfluoro(2-butyltetrahydrofuran). The glass transition temperature of the polymer was 108° C., and it was a tough transparent glass-like polymer at room temperature. Further, a 10% thermal decomposition temperature was 465° C., and the light transmittance was as high as at least 95%. The surface energy of this polymer was 19 dyn/cm².

PREPARATION EXAMPLE 3

Perfluoro(2,2-dimethyl-1,3-dioxole) and tetrafluoroethylene were radical-polymerized to obtain copolymer C having a glass transition temperature of 160° C. This polymer was colorless transparent. The refractive index was 1.3, and the light transmittance is high. The surface energy of this polymer was 19 dyn/cm².

EXAMPLE 1

The fluorine-containing polymer obtained in Preparation Example 1 was dissolved in perfluorotributylamine to obtain a 9% solution. This solution was coated by a spin coater on a 6 inch wafer having a semiconductor element (CMOS-DRAM) formed thereon, followed by drying at 50° C. for one hour and at 180° C. for one hour to form a protective film having a thickness of 3 μm.

On this wafer having the fluorine resin protective film formed thereon, a solution prepared by adding 0.05% of Surflon S-381 (acrylate oligomer having polyfluoroalkyl groups, manufactured by Asahi Glass Company Ltd.) as a surfactant to a 27.3% solution of a positive photoresist OFPR-800 (manufactured by Tokyo Ohka Kogyo Co., Ltd.), was coated by spin coating, followed by drying on a hot plate, then by baking, exposure and development, and then etching by an oxygen plasma was conducted to carry out perforation processing to form 100 μm angular holes for wire bonding on the fluorine resin protective film. The semiconductor element having a protective film thus formed had excellent properties even after a moisture resistance test.

EXAMPLE 2

A semiconductor having a protective film was prepared in the same manner as in Example 1 except that a fluorine-containing polymer obtained in Preparation Example 2 was used, and Surflon S-382 (acrylate oligomer having polyfluoroalkyl groups, manufactured by Asahi Glass Company Ltd.) was used as a surfactant. The semiconductor element thus obtained showed excellent properties at the initial stage and after the moisture resistance test.

EXAMPLE 3

A semiconductor having a protective film was prepared in the same manner as in Example 1 except that the fluorine-containing polymer obtained in Preparation Example 3 was used, and Surflon S-207 (acrylate oligomer having polyfluoroalkyl groups, manufactured by Asahi Glass Company Ltd.) was used as a surfactant. The semiconductor element thus obtained showed excellent properties at the initial stage and after the moisture resistance test.

EXAMPLE 4

The fluorine-containing polymer obtained in Preparation Example 1 was dissolved in perfluorotributylamine to obtain a 9% solution. This solution was coated by a spin coater on a 6 inch wafer having a semiconductor element (CMOS-DRAM) formed thereon, followed by drying at 50° C. for one hour and at 180° C. for one hour to form a protective film having a thickness of 3 $\mu$m.

On this wafer having the fluorine resin protective film formed thereon, an adhesion-improving agent (OAP, tradename, manufactured by Tokyo Ohka Kogyo Co., Ltd.) having 0.05% of Surflon SC-101 (acrylate oligomer having polyfluoroalkyl groups, manufactured by Asahi Glass Company Ltd.) added as a surfactant, was coated by spin coating, followed by drying on a hot plate. Then, a positive photoresist HPR-207 (manufactured by Fuji-Hunt Electronics Technology Co., Ltd.) was spin-coated thereon, followed by baking, exposure and development, and then etching by an oxygen plasma was conducted to carry out perforation processing to form 100 $\mu$m angular holes for wire bonding on the fluorine resin protective film. The semiconductor element having a protective film thus formed, had excellent properties even after the moisture resistance test.

EXAMPLE 5

A semiconductor having a protective film was prepared in the same manner as in Example 4 except that the fluorine-containing polymer obtained in Preparation Example 2 was used, and Surflon S-105 (acrylate oligomer having polyfluoroalkyl groups, manufactured by Asahi Glass Company Ltd.) was used as a surfactant. The semiconductor element thus obtained showed excellent properties at the initial stage and after the moisture resistance test.

EXAMPLE 6

A semiconductor having a protective film was prepared in the same manner as in Example 4 except that the fluorine-containing polymer obtained in Preparation Example 3 was used, and Surflon S-111 (acrylate oligomer having polyfluoroalkyl groups, manufactured by Asahi Glass Company Ltd.) was used as a surfactant. The semiconductor element thus obtained showed excellent properties at the initial stage and after the moisture resistance test.

COMPARATIVE EXAMPLE 1

The fluorine-containing polymer obtained in Preparation Example 2 was dissolved in perfluorotributylamine to obtain a 9% solution. This solution was coated by a spin coater on a 6 inch wafer having a semiconductor element (CMOS-DRAM) formed thereon, followed by drying at 50° C. for one hour and at 80° C. for one hour to form a protective film having a thickness of 3 $\mu$m. On this wafer having the fluorine resin protective film formed thereon, a 27.3% solution of a positive photoresist OFPR-800 (manufactured by Tokyo Ohka Kogyo Co., Ltd.) was coated by spin coating at 500 rpm, whereby the photoresist solution was entirely scattered during the rotation, and it was impossible to form a photoresist layer.

COMPARATIVE EXAMPLE 2

A protective film having a thickness of 3 $\mu$m was formed in the same manner as in Comparative Example 1 using the fluorine-containing polymer obtained in Preparation Example 2. Then, a positive photoresist HPR-207 (Manufactured by Fuji-Hunt Electronic Technology Co., Ltd.) was spin coated. The photoresist layer was partially repelled and non-uniform. Then, baking, exposure and development were conducted by usual methods, and etching by an oxygen plasma was conducted to carry out perforation processing to form 100 $\mu$m angular holes for wire bonding on the fluorine resin protective film. With the semiconductor element having a protective film thus formed, the defective ratio by the moisture resistance test was high.

According to the present invention, a photoresist or adhesion-improving agent having a surfactant incorporated thereto, is used, whereby fine processing of the fluorine resin thin film having a high fluorine content and a low surface energy can be made possible, and it is possible to obtain a semiconductor element having a protective film having excellent properties such as a low dielectric constant and a low water absorptivity.

What is claimed is:

1. A process for producing a semiconductor having a thin film of a fluorine resin as a protective film, which comprises coating on the surface of a fluorine resin a photoresist solution containing a surfactant, followed by exposure, development and etching for fine processing of the fluorine resin.

2. The process according to claim 1, wherein the thin film of a fluorine resin is a thin film of a fluorine resin formed by spin coating.

3. The process according to claim 1, wherein the fluorine resin is a fluorine resin having a fluorine-containing aliphatic cyclic structure in its backbone chain.

4. The process according to claim 1, wherein the fluorine resin is a polymer obtained by cyclic polymerization of a monomer selected from the group consisting of perfluoroallyl vinyl ether and perfluorobutenyl vinyl ether.

5. The process according to claim 1, wherein the fluorine resin is a copolymer of perfluoro(2,2-dimethyl-1,3-dioxole) and tetrafluoroethylene.

6. The process according to claim 1, wherein the surfactant is a fluorine-containing surfactant.

7. The process according to claim 1, wherein the surfactant is a nonionic fluorine-containing surfactant.

8. The process according to claim 1, wherein surfactant is an acrylate oligomer having polyfluoroalkyl groups.

9. A process for producing a semiconductor having a thin film of a fluorine resin as a protective film, which comprises coating on the surface of a fluorine resin a liquid containing a surfactant, then coating a solution of a photoresist, followed by exposure, development and etching for fine processing of the fluorine resin.

10. The process according to claim 9, wherein the thin film of a fluorine resin is a thin film of a fluorine resin formed by spin coating.

11. The process according to claim 9, wherein the fluorine resin is a fluorine resin having a fluorine-containing aliphatic cyclic structure in the backbone chain.

12. The process according to claim 9, wherein the fluorine resin is a polymer prepared by cyclic polymerization of a monomer selected from the group consisting of perfluoroallyl vinyl ether and perfluorobutenyl vinyl ether.

13. The process according to claim 9, wherein the fluorine resin is a copolymer of perfluoro(2,2-dimethyl-1,3-dioxole) and tetrafluoroethylene.

14. The process according to claim 9, wherein the surfactant is a fluorine-containing surfactant.

15. The process according to claim 9, wherein the surfactant is a nonionic fluorine-containing surfactant.

16. The process according to claim 9, wherein the surfactant is an acrylate oligomer having polyfluoroalkyl groups.

17. The process according to claim 9, wherein the liquid containing a surfactant is an adhesion-improving agent containing a surfactant.

* * * * *